Figure 1:
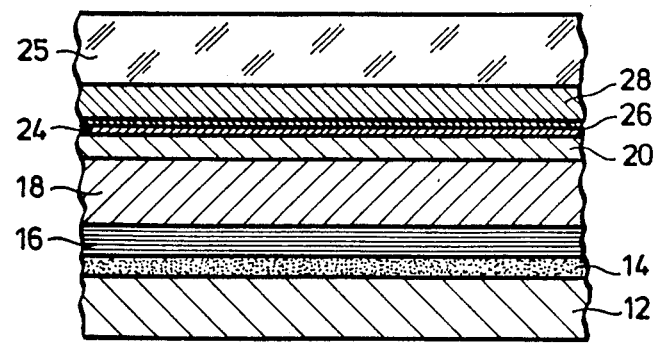

United States Patent [19]

Wörner

[11] Patent Number: 4,709,119
[45] Date of Patent: Nov. 24, 1987

[54] PHOTOVOLTAIC CELL AND METHOD OF MAKING SAME

[75] Inventor: Jörg Wörner, Grosskrotzenburg, Fed. Rep. of Germany

[73] Assignee: Nukem GmbH, Hanau, Fed. Rep. of Germany

[21] Appl. No.: 936,090

[22] Filed: Nov. 28, 1986

[30] Foreign Application Priority Data

Nov. 28, 1985 [DE] Fed. Rep. of Germany ....... 3542116

[51] Int. Cl.$^4$ ..................... H01L 31/06; H01L 31/18
[52] U.S. Cl. ..................................... 136/260; 357/16; 357/30; 427/39; 427/74; 136/255; 437/5
[58] Field of Search .................. 136/255, 260; 357/16, 357/30; 29/572; 427/39, 74, 86

[56] References Cited

U.S. PATENT DOCUMENTS

| 3,888,697 | 6/1975 | Bogus et al. | 136/260 |
| 4,251,286 | 2/1981 | Barnett | 136/260 |
| 4,463,215 | 7/1984 | Bassett et al. | 136/244 |

FOREIGN PATENT DOCUMENTS

| 2944913 | 9/1980 | Fed. Rep. of Germany | 136/258 AM |
| 3135933 | 5/1982 | Fed. Rep. of Germany | 136/255 |
| 3141241 | 8/1982 | Fed. Rep. of Germany | 136/260 |
| 2536913 | 6/1984 | France | 136/260 |

OTHER PUBLICATIONS

A. Banerjee et al., "$Zn_xCd_{1-x}S/Cu_2S$ Heterojunction Solar Cells . . . ", Solid State Electronics, vol. 22, pp. 495-499.

L. D. Partain et al., "Degradation of a $Cu_xS$/CdS Solar Cell in Hot . . . ", J. Appln. Physics, vol. 55, Nov. 1983, pp. 6708-6720.

L. D. Partain et al., "Surface Chemistry of $Cu_xS$ and $Cu_xS$/CdS . . . ", J. Appl. Physics, vol. 57, Jun. 1, 1985, pp. 5056-5065.

Dr. H. G. Bogensberger, "Entwicklung und Einsatz Von ($CdS.Cu_2S$) . . . , Nukem GmbH, Solar-Presentation in Jun. 1973 at Hanau-Wolfgang.

G. H. Hewig et al., Conference Record, 16th IEEE Photovoltaic Specialists Conf. (1982), pp, 713-718.

Primary Examiner—Aaron Weisstuch
Attorney, Agent, or Firm—Cushman, Darby & Cushman

[57] ABSTRACT

A thin film solar cell is proposed, in which the surface of the semiconductor layer (20) facing the front contact (28) is designed as an inversion layer, which can be tunnelled through by the charge carriers electrons and holes.

14 Claims, 3 Drawing Figures

PHOTOVOLTAIC CELL AND METHOD OF MAKING SAME

BACKGROUND OF THE INVENTION

The invention relates to a photovoltaic cell comprising at least one electrically conductive back contact, a first semiconductor layer arranged on said contact, an adjacent second semiconductor layer of different conductivity type or a Schottky barrier layer, and an electrically conductive front contact, in particular to a copper sulphide/cadmium sulphide thin film solar cell, and to a method for fabrication of a said cell.

In photovoltaics, there is a choice of expensive crystalline solar cells with an efficiency of 10% and above, and cheap thin film solar cells with an efficiency of 4 to 8%, of the amorphous silicon or copper sulphide/cadmium sulphide ($Cu_2S/CdS$) types. The former are not in demand due to their high manufacturing costs; but the less expensive thin film solar cells are also unable to achieve the hoped-for breakthrough, particularly because they are insufficiently stable over a long period, for example 6 to 10 years, i.e. they fail to retain their initial power. The efficiency of a thin film solar cell of the $Cu_2S/CdS$ type is strongly dependent on the stoichiometry of the copper sulphide, which has the function of the absorber in the solar cell, so that a direct influence can be derived on the number of charge carriers formed and on the current density achievable. To show the optimum characteristics, the stoichiometry should be between $Cu_{1.995}S$ and $Cu_{2.000}S$. Since this copper sulphide represents the surface of the solar cell system, interaction with the oxygen in the air or the cover materials used must be considered. Copper oxide $Cu_{2-z}O$ (with $0 \leq z \leq 1$) is formed, drawing its copper atoms from the copper sulphide, which thus has the function of the copper supplier for the copper oxide. Since the copper sulphide layer is only approx. 300 nm thick and the growing copper oxide can increase up to a thickness of 5–10% of the thickness of the copper sulphide, a considerable reduction of the copper stoichiometry can be observed as a consequence; the stoichiometry drops to $Cu_{1.90}S$ even when the initial values are very good.

DE-OS No. 21 52 895 attempts to increase the efficiency of a thin film solar cell of the copper sulphide/cadmium sulphide type and to maintain it at a high level by the copper oxide layer, resulting from degradation, being formed simultaneously with an improvement in the stoichiometry of the copper sulphide. Ageing of the front copper sulphide semiconductor would therefore be incorporated into the manufacturing process of the solar cell. To do so, it is proposed that a further copper-containing layer be deposited onto the copper sulphide layer, said copper-containing layer being thin in relation to the copper sulphide layer. The additional layer can be obtained by, for example, deposition of an additional layer containing copper, and subsequent heat treatment in vacuum or in air. It is also possible to generate the copper content for the additional layer by reducing the copper sulphide layer on the surface. To do so, the surface can be reduced by treatment in a glow discharge in a hydrogen atmosphere. However, all these measures to provide for arrangement of a separate layer onto the copper sulphide layer, have not yet shown the hoped-for success as regards longterm stability.

The object of the present invention is to develop a photovoltaic cell of the type mentioned at the outset in such a way that the front layer, i.e. the second semiconductor layer, is formed as a whole with high stoichiometry, i.e. without vacancies, and that the layer so formed is not subject to copper, thus stoichiometric, depletion even over long periods, so precluding the possibility of degradation. (High stoichiometry is used in this instance in the semiconductor technology sense and means that each sulphur ion is matched with exactly 2 copper ions. This absence of vacancies is expressed by $Cu_{2.0000}S$ for the copper sulphide. Formulations like, for example, $Cu_{2.00}S$ or $Cu_2S$ corresponding to chemical nomenclature, do not adequately express the desired absence of vacancies.)

The object is attained in accordance with the invention by the formation of an inversion layer on the semiconductor and which is tunnelled through by electrons or holes but not by ions, and that a low-resistivity layer that conducts electrons or holes well is arranged between the semiconductor inversion layer and the electrically conductive contact.

The formation of the inversion layer on the surface of the second semiconductor layer ensures that a stoichiometry once given, is not deteriorated, so preventing a reduction of the curent density achievable during irradiation. This is achieved by the function of the inversion layer, which interdicts penetration by ions, but permits the passage of electrons or holes, which are the charge carriers determining the conversion efficiency of the solar cell (the probability of ion tunnelling is negligible in view of the considerably greater mass of the ions compared with the mass of the electrons or holes).

A particular feature of the invention is a photovoltaic cell in the form of a $Cu_{2-x}S/CdS$ thin film solar cell with $0 \leq x \leq 1$. The $Cu_{2-x}S$ layer is formed with high stoichiometry having approximately $x = 0.0000$ and the inversion layer is arranged on the surface of the $Cu_{2.0000}S$ layer. The inversion layer can have a thickness from approx. 1 to 5 nm.

The inversion layer is generated by strongly reducing species, for example a negatively charged hydrogen atom ($H^-$) interacting with the surface of the p-semiconductor, i.e. the copper sulphide.

These reducing adsorbates act on the surface layer as electron donators. The result is that the surface layer receives a negative potential while the layer beneath it receives a positive one for charge neutrality reasons. For ions, these layers are an impenetrable potential wall, while the charge carriers (electrons and holes) can tunnel through them. The copper sulphide surface built up as an inversion layer therefore acts as a semipermeable wall.

The precondition for formation of a suitable inversion layer is that the copper sulphide is pure copper sulphide, with neither copper oxide nor excess sulphur ions being present. Since these components disturbing the stoichiometry of the copper sulphide layer always crop up during fabrication of the said layer, the invention selectively reduces copper oxide on the surface of the copper sulphide layer and removes free sulphur ions, and then by adsorption of the reducing species and interaction thereof with the p-semiconductor $Cu_{2.0000}S$, converts the surface of the said semiconductor into an inversion layer. If, for example, there was still an oxide layer on the p-semiconductor at this juncture, formation of an inversion layer would not be possible. The reason for this is that when electron holes are present in the not highly stoichiometric $Cu_{2-x}S$ or $Cu_{2-z}O$, the electrons of the adsorbed donators directly recombine with these electron holes, as is required in DE-OS No. 21 52 895 (wherein the surface layer of the copper sulphide is converted to copper without the volume material beneath it being changed). The inversion layer ensures that there is no degradation of the copper sulphide layer even over long periods, i.e. that a high stoichiometry is retained once it has been achieved.

Since, however, the pure copper sulphide layer is of relatively high electrical resistivity, so that movement by the charge carriers to the electrically conductive front contact, determining the conversion efficiency of the solar cell, is impeded, a further embodiment of the invention involves continuation of the reduction process even after the build-up of the inversion layer, in order to convert the free surface thereof into pure copper which is then selectively oxidized to form $Cu_{2-y}O$ in a subsequent heating process. This oxide layer is at least one order of magnitude less resistive than $Cu_{2.0000}S$ and represents a highly conductive connection for the charge carriers between the front semiconductor layer and the electrically conductive front contact arranged on the oxide layer. (It would theoretically be possible to dispense with the $Cu_{2-y}O$ layer, provided a dense front contact grid was applied directly to the inversion layer; but this would have the drawback that an unwelcome shading effect would occur. However, degradation would not occur. It is therefore possible to apply the copper layer for the copper oxide in another process too, for example vacuum deposition or galvanic deposition.)

To carry out the reduction in a controlled manner, the known discharge process is modified such that after the electrically conductive rear contact, the cadmium sulphide layer, and the $Cu_{2-x}S$ layer have been applied, they are placed in a hydrogen atmosphere as a single unit, preferably in the positive column of the glow discharge. Preferably, the carrier with the layers arranged thereon is placed in an initially evacuated space (approx. $10^{-6}$ mbar ($10^{-4}$ Pa)), which is then filled with hydrogen to a pressure of approx. 0.5 mbar (50 Pa). Once the pressure has stabilized at 0.5 mbars (50 Pa), the glow discharge proper takes place, in which the hydrogen radicals or $H^-$ ions effect the reduction of the $Cu_{2-x}S$ layer to an extent that the highly stoichiometric $Cu_{2.0000}S$ layer is formed, the surface of which is converted to the inversion layer whose surface is in turn converted to pure copper. It must be ensured here that the reducing species does not merely effect the reduction of the $Cu_{2-x}S$ layer surface to elementary copper while leaving the volume material located thereunder unchanged as a $Cu_{2-x}S$ layer, as described in DE-OS No. 21 52 895.

Heating then follows. This can take place, for example, either at 180° C. or 200° C. in vacuum followed by 150° C. in air. By reduction of the $Cu_{2.0000}S$ layer after formation of the inversion layer followed by heating, a controlled oxide formation takes place. By way of comparison, a defined thickness of the copper oxide $Cu_{2-y}O$ is not possible in other manufacturing processes if the copper layer necessary for the oxide layer is directly deposited on the front semiconductor. Here, oxide from the heating stage and residual oxides oxides already formed during the manufacturing process of the semiconductor become mixed.

Furthermore, it must be emphasized that the process steps (a) Formation of the highly stoichiometric $Cu_{2.0000}S$ layer, (b) Formation of the inversion layer and, if applicable, and (c) Formation of copper and the copper oxide layer, follow one another in controlled sequence by recording the H$_2$S partial pressure detected in the glow discharge chamber. It is therefore necessary, for example with a current density of 10 μA/cm$^2$ of semiconductor layer at a voltage between cathode and anode of 300 V and a gas pressure of approx. 50 Pa ($5.10^{-4}$ bars) in the glow discharge chamber, that the partial pressure of the H$_2$S be steeply rising at the start of the glow process, for a period of approx. 5 mins. (conversion of the $Cu_{2-x}S$ layer into a $Cu_2S$ layer), then to remain almost unchanged until approx. 10 mins. after the start of the process (formation of the inversion layer), and then to rise gently (formation of the copper layer).

Further details, advantages and features of the invention can be seen in the following description of the drawing.

Figure 2:
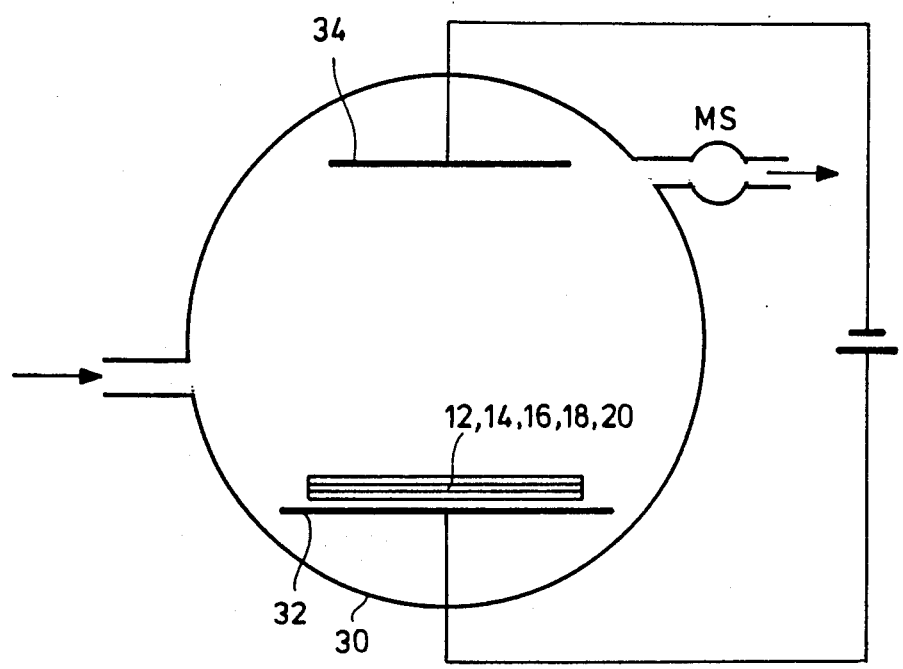
Figure 3:
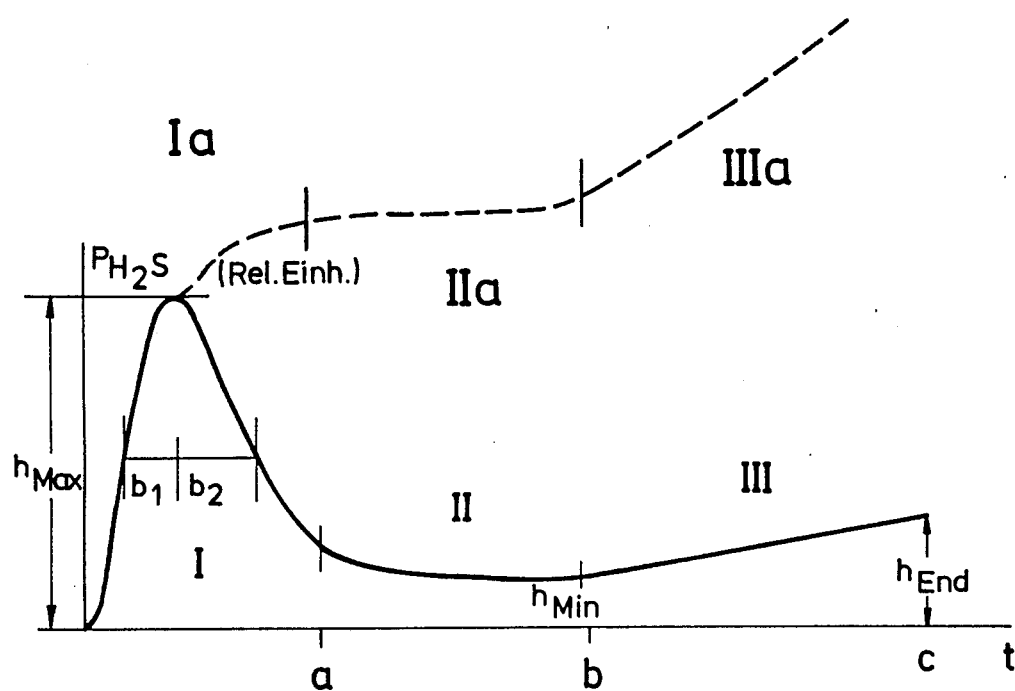

FIG. 1 shows a schematic representation of a section through a thin film solar cell FIG. 2 shows an arrangement of a device for glow discharge and FIG. 3 shows the course of a manufacturing process while observing the H$_2$S partial pressure.

FIG. 1 shows a copper sulphide/cadmium sulphide solar cell 10 in a purely schematic and enlarged form. On a carrier such as a substrate 12, cleaned for example in a solvent with ultrasonic sound, an adhesion-promoting layer 14 in the form of, for example, vacuum-deposited or sputtered titanium, can be deposited, in order to arrange a first electrically conductive rear contact 16 thereon. This contact can consist of silver and also be applied by vacuum deposition or sputtering. A layer of cadmium sulphide 18 is then vacuum-deposited onto the silver layer 16. The cadmium sulphide layer can be briefly treated in aqueous hydrochloric acid to reduce reflections and to etch out grain boundaries. The thickness of the cadmium sulphide layer is approx. 10 to 20 μm. A copper sulphide layer 20 (thickness approx. 200-500 nm) is then generated on the cadmium sulphide layer 18 by immersing said cadmium sulphide layer in a hot, preferably aqueous copper (I) chloride solution, with the surface of the cadmium sulphide being converted in an ion exchange process into copper sulphide.

This $Cu_{2-x}S$ layer has a stoichiometry with x from 0.01 to 0.04, for example. Simultaneously, part of the surface of the copper sulphide layer 20 is oxidized. This $Cu_{2-z}$ with $0 \leq z \leq 1$ is not shown in FIG. 1. This $Cu_{2-z}O$ layer and the non-highly stoichiometric $Cu_{2-x}S$ layer have a negative influence on the conversion efficiency of the photovoltaic cell 10. In addition, degradation, i.e. copper depletion in the copper sulphide layer 20, can occur in the long term.

To avoid this, the copper sulphide layer 20 is reduced in a controlled manner, by means of glow discharge in a hydrogen atmosphere. To do so, the substrate 12 with the layers 14, 16, 18, and 20 is arranged in the vicinity of an anode 32 arranged together with a cathode 34 in a glow discharge chamber 30. The glow discharge chamber 30 is then evacuated to a pressure of approx. $10^{-6}$ mbars ($10^{-4}$ Pa). This is followed by controlled flowing with hydrogen, to the extent that a constant pressure of approx. 0.5 mbars (50 Pa) is achieved. Glow discharge then takes place. The current density is 10 μA/cm$^2$ of semiconductor layer. The voltage applied between the electrodes is 300 V. The hydrogen radical or H⁻ ions now enable a complete reduction of the $Cu_{2-z}O$ layer and the removal of excess sulphur ions from the $Cu_{2-x}S$ layer 20. This reduction can be traced by means of the H₂S content of the hydrogen flowing through the glow discharge chamber 30 (see FIG. 3). The H₂S content indicates whether the reduction has been completed. If so, the result is a highly stoichiometric $Cu_{2-x}S$ layer with x being approx. 0.0000. Further treatment of this layer converts its surface into an n type semiconductor inversion layer 24 which may have a layer thickness of 1 to 5 nm. Electrons and holes, i.e. charge carriers determining the conversion efficiency of the finished solar cell, can tunnel through this inversion layer 24, whereas ions cannot. This ensures that a stoichiometry depletion of the $Cu_{2.0000}S$ layer 20 cannot occur. (This was proved by heating the completed semiconductor layers of the solar cell in air at 180° C. for several hours; the layer thickness of the copper oxide $Cu_{2-y}O$ did not increase.)

Relatively low-resistivity layer 26 is applied on top of the $Cu_{2.0000}S$ layer 20 and the inversion layer 24, in order to conduct charge carriers through these to a front contact. This additional layer 26 is obtained by reducing the free surface of the inversion layer 24 in a glow discharge process so that a pure copper layer 26 is formed. The thickness of the said layer 26 is approx. 1 nm and can be obtained in a controlled manner in the glow process. The substrate 12 with the layers 14, 16, 18, 20, 24, 26 is then removed from the glow discharge chamber for subsequent heating, e.g. in a normal atmosphere at 180° C. or first in a vacuum at 200° C. and then in a normal atmosphere at 150° C. The copper layer 26 is thus oxidized, i.e. a $Cu_{2-y}O$ layer with $0 \leq y \leq 1$ is formed. A contact 28 is then arranged on this lowresisitivity layer 26, via which contact the charge carriers are conducted. Finally, the solar cell 10 can be encapsulated using covering material and a cover plate 25.

A correspondingly manufactured solar cell 10 has a highly stoichiometric copper sulphide layer 20 which, thanks to the inversion layer 24 arranged on its surface, is not subject to a stoichiometry depletion even after using over a long period of 5 to 10 years, for example. Degradation detrimental to the life of the solar cells 10 therefore does not occur. Low-cost manufacture is possible partly because the thin film solar cells are made with large surfaces and can be subjected to the glow discharge process which can be tightly controlled.

To be able to determine whether the formation of the thin-film solar cell 10 meets requirements with regard to the copper sulphide layer 20 and the inversion layer 24 arranged thereabove, and if applied, to the copper or copper oxide layer, the process in the glow discharge chamber 30 during the glow process can be monitored using the H₂S partial pressure. It should be noted in addition that the partial pressure of $5.10^{-4}$ bars = 50 Pa, set in the glow discharge chamber, is maintained while hydrogen gas is flowing through the said discharge chamber.

Unless the glow discharge process takes place with the hydrogen atmosphere being replaced, there is a steep rise (range Ia) in the period corresponding to range I, followed by a plateau (range IIa). The H₂S partial pressure then rises steadily (range IIIa).

In FIG. 2, this is indicated by feed and discharge pipes shown with arrows. A mass spectrometer designated MS is also arranged in the discharge pipe to determine the H₂S partial pressure (it is of course possible to use other elements as parameters instead of the H₂S partial pressure, for example the H₂O generated from the copper oxide).

FIG. 3 now makes clear when the manufacturing process is proceeding according to the invention, i.e. when first the copper oxide present on the copper sulphide layer and the excess sulphur ions present in the copper sulphide layer are reduced to generate a highly stoichiometric $Cu_{2.0000}S$ layer 20. In the H₂S partial pressure curve plotted above the time t, this is expressed in range I with its steeply rising H₂S partial pressure, which then drops again. The apex of this curve must be offset in relation to its half-width towards the shorter time, i.e b2 is greater than b1.

Then, in range II, the H₂S partial pressure drops slightly, to reach a minimum at point-in-time b. If this range can be detected, whose duration corresponds to that of range I, it must be assumed that the inversion layer 24 has formed. After range II, the H₂S partial pressure rises steadily in range III. In this range, sulphur is drawn from the surface of the copper sulphide inversion layer, forming H₂S. Copper is formed at the same time.

In the period c−b, the thickness of the copper layer can be set in a controlled manner, as can the thickness of the copper oxide layer.

In the embodiment of FIG. 3, the periods a, b, and c add up from a=5 mins, b−a=5 mins and c−b=approx. 10 mins, with the permanent internal pressure of $5.10^{-4}$ bars (=50 Pa) in the glow discharge chamber 30 with a current density of 10 μA/cm of semiconductor layer, a voltage of 300 V between electrodes 32 and 34, and with the glow discharge chamber 30 flushed, in such a way that the volume of the container 30 is completely changed twice every minute.

As a general point it can be stated that the area of range I must be in a ratio of (2.5+/−0.5) to 1 in relation to that of range II. If these values are complied with, and the maximum of range I offset towards the shorter time, it ensures that the finished thin film solar cell 10 has the structure according to the invention.

Of course, the principles according to the invention are not only applicable for the "front wall" solar cell 10, in which copper sulphide is the top semiconductor layer 20 facing the front contact 28: these principles are also applicable for manufacture of a "backwall" solar cell structure of glass substrate 12/transparent front contact (e.g. $SnO_x$)14, 16/CdS layer 18/$Cu_{2-x}S$ layer 20 /rear contact 28 wherein the copper sulphide is the semiconductor layer facing the rear, electrically conducting contact. The same applies for the semiconductor materials $Cu_2S/Zn_wCd_{1-w}S$ with $0 \leq w \leq 0.3$, permitting an improvement in conversion efficiency of the solar cell 10 from 10% to 13%.

I claim:
1. A photovoltaic cell having a first electrically conductive contact, a first semiconductor layer, a second semiconductor layer of opposite type of conductivity, and a second electrically conductive contact, arranged in the stated order in layers one above the other, and a further layer capable of being tunnelled through by electrons and holes, said further layer being arranged between one of the semiconductor layers and the nearest electrically conductive contact, characterized in that the further layer is a semiconductor inversion layer not permeable to ions, that the inversion layer is formed on the said one semiconductor layer, and that a low-resistivity layer that conducts electrons or holes well is arranged between the semiconductor inversion layer and the said nearest electrically conductive contact.

2. A photovoltaic cell according to claim 1 in the form of a $Cu_{2-x}S/CdS$ thin film solar cell, characterized in that
the $Cu_{2-x}S$ layer is a p-semiconductor layer and highly stoichiometric with approx. $x=0.0000$, that the inversion layer is an n-semiconductor layer and is formed from the surface of the $Cu_{2.0000}S$ layer, and that a $Cu_{2-y}O$ layer with $0 \leq y \leq 1$ is arranged between the inversion layer and the electrically conductive contact.

3. A photovoltaic cell according to claim 2, characterized in that
the inversion layer has a thickness of 1–5 nm.

4. A photovoltaic cell according to claim 2, characterized in that
the $Cu_{2-y}O$ layer is arranged on the inversion layer, said $Cu_{2-y}O$ layer having a thickness of approx. 1 nm and being formed from the surface of the inversion layer.

5. A photovoltaic cell according to claim 2, characterized in that
the CdS layer is completely or partially replaced by a $Zn_wCd_{1-w}S$ layer with $0 \leq w \leq 0.3$.

6. A photovoltaic cell according to claim 1, characterized in that
the photovoltaic cell (10) is a front wall or a back wall solar cell.

7. A method for manufacture of a $Cu_{2-x}S/CdS$ thin film photovoltaic solar cell, comprising the sequential process steps
(a) formation of the CdS layer on a first electrically conductive rear contact,
(b1) formation of the $Cu_{2-x}S$ layer on the CdS layer by vacuum deposition or sputtering of copper sulphide or immersion of the cadmium sulphide layer into a hot aqueous copper (I) chloride solution,
(c) formation of an electrically conductive front contact and if necessary encapsulation of the solar cell,
characterized by the further process steps following (b1)
(b2) reduction in a hydrogen atmosphere glow discharge of $Cu_{2-z}O$ with $0 \leq z \leq 1$ present on the $Cu_{2-x}S$ layer and of excess sulphur ions from the $Cu_{2-x}S$ layer until a highly stoichiometric $Cu_{2.0000}S$ layer is obtained,
(b3) formation of a semiconductor inversion layer on and from the highly stoichiometric $Cu_{2.0000}S$ layer by adsorption of $H^-$ ions from the hydrogen atmosphere of the glow discharge,
(b4) reduction of the free surface of the inversion layer to elementary copper or application of elementary copper to the inversion layer,
(b5) oxidation of elementary copper to $Cu_{2-y}O$ with $0 \leq y \leq 1$.

8. A method according to claim 7 characterized in that
the $Cu_{2.0000}S$ layer is arranged in the positive column of the glow discharge to form the inversion layer.

9. A method according to claim 7, characterized in that
glow discharge to form the inversion layer takes place in an evacuated space, initially set to a pressure $p \neq 10^{-6}$ mbars ($10^{-4}$ Pa), and that the space is then filled with hydrogen to achieve a pressure of 0.5 mbars (50 Pa) in order to conduct the glow discharge.

10. A method according to claim 9, characterized in that
the glow process takes place at a current density of 10 $\mu A/cm^2$ semiconductor layer and at a voltage between the electrodes of 300 V.

11. A method according to claim 7, characterized in that
the hydrogen atmosphere of the glow discharge space is replaced during the glow discharge process without changing the internal pressure.

12. A method according to claim 11, characterized in that
replacement of the hydrogen atmosphere takes place about twice every minute.

13. A method according to claim 7, characterized in that
the timing of the glow process is such that the $H_2S$ partial pressure resulting from the reduction of the $Cu_{2-x}S$ layer and measured with the hydrogen atmosphere being continually replaced first rises steeply and, after passing a maximum, drops steeply again (range I) with the maximum being offset to shorter time, that a gradual reduction of the $H_2S$ partial pressure ensures to a minimum (range II), and that then the $H_2S$ partial pressure rises almost continuously (range III).

14. A method according to claim 13, characterized in that
the ratio of the area of range I to that of range II is as $(2.5+/-0.5)$ to 1.

* * * * *